United States Patent [19]
Blessing et al.

[11] Patent Number: 5,977,751
[45] Date of Patent: Nov. 2, 1999

[54] BATTERY MONITORING UNIT HAVING A SENSE FET CIRCUIT ARRANGEMENT

[75] Inventors: Alf Blessing, Heiningen; Peter Hille, Darmstadt, both of Germany

[73] Assignee: Daimler-Benz Aktiengesellschaft

[21] Appl. No.: 09/028,096

[22] Filed: Feb. 23, 1998

[30] Foreign Application Priority Data

Feb. 21, 1997 [DE] Germany ............... 197 06 946

[51] Int. Cl.⁶ .............................................. H01M 10/46
[52] U.S. Cl. ............................................ 320/134; 320/136
[58] Field of Search .................................. 320/127, 128, 320/132, 134, 136, 163

[56] References Cited

U.S. PATENT DOCUMENTS

| | | |
|---|---|---|
| 5,084,633 | 1/1992 | Izadinia . |
| 5,142,215 | 8/1992 | Mathison ............................ 320/141 |
| 5,583,384 | 12/1996 | Henry ................................. 307/113 |

FOREIGN PATENT DOCUMENTS

| | | |
|---|---|---|
| 0 747 713 | 12/1996 | European Pat. Off. . |
| 38 35 662 | 4/1990 | Germany . |
| 43 39 568 | 5/1995 | Germany . |
| 195 20 735 | 12/1996 | Germany . |

*Primary Examiner*—Edward H. Tso
*Attorney, Agent, or Firm*—Evenson, McKeown, Edwards & Lenahan, PLLC

[57] ABSTRACT

A battery monitoring unit is provided with a semiconductor power switch, which is looped into the battery lead and can serve for interrupting the battery current in a controlled manner. The battery monitoring unit comprises a sense FET circuit arrangement, which determines the battery current bidirectionally and the power FET part of which forms the semiconductor power switch, which is looped into the battery lead. Aside from the controllable interruption of battery current, a bidirectional determination of battery current and, with that, a continuous monitoring of the charge state of the battery is possible with this circuit arrangement, and can be used for monitoring vehicle batteries.

19 Claims, 2 Drawing Sheets

BATTERY MONITORING UNIT HAVING A SENSE FET CIRCUIT ARRANGEMENT

BACKGROUND AND SUMMARY OF THE INVENTION

The invention relates to a battery monitoring unit with a semiconductor power switch coupled into a battery lead.

A battery monitoring unit of the type mentioned above was introduced by the White Products company at the fifteenth meeting of "Elektronik im Kraftfahrzeug" (Electronics in the Motor Vehicle) in 1995 in Essen in the form of a modular unit for motor vehicle batteries, the modular unit being coupled to a battery terminal. The purpose of the semiconductor power switch there is to have the ability to switch off the battery current in a controlled manner, for example, as protection against unauthorized use of the vehicle or as short circuit protection.

German Patent document DE 43 39 568 A1 discloses an apparatus for determining the charge state of a battery. The apparatus carries out a charge balance of the battery by evaluating the charging and discharging currents and, with the help of a measurement, checks and corrects the off-load voltage of the battery. Furthermore, the use of this procedure for an on-board electrical supply system of the vehicle is shown, which comprises a generator, the output voltage of which is controlled by a voltage regulator, a battery, which is charged by the onboard generator, and electrical supply system consumers, which can be connected over switching circuits to the supply voltage made available by the generator or the battery. The method for determining the charge state of the battery is implemented in a computer, which receives suitable measured values, particularly with regard to the battery voltage, the off-load voltage, the charging current, the discharging current, as well as the temperature of the battery.

German Patent document 38 35 662 C2 discloses an MOS-FET used as a reverse battery protection circuit within an apparatus for energizing inductive consumers in a motor vehicle.

U.S. Pat. No. 5,084,633 describes a circuit arrangement for the bidirectional determination of current for a power MOS-FET, particularly for a DMOST. For this purpose, the respective DMOST is constructed so that it has a relatively low-ohm sampling resistance in series with its drain connection.

In the field of power FETs, which are composed of a plurality of integrated individual FET components connected in parallel, so-called sense FET circuit arrangements are known, which make it possible to measure the frequently comparatively high amperage flowing over the power FETs with relatively little loss. For this purpose, a few individual FET components are combined into a so-called sense FET part, while the large number of remaining individual FET components form the actual power part, which lies with its source-drain segment in the power circuit. By suitable wiring, it is ensured that a fraction of the current, which flows over the power segment and corresponds exactly to the ratio of the number of individual sense FET components to those of the individual power FET components, is diverted over the sense FET part. This diverted measurement current, which is consequently clearly less than that in the power segment, can be measured with little dissipation of power, for example, as a voltage drop, at a sense resistance. Such sense FET circuit arrangements are described, for example, in the German Patent document 195 20 735 A1 and in the literature cited there.

It is an object of the invention to solve the technical problem of making available a battery monitoring unit, which offers, with relatively little effort, the possibility of switching off the battery current in a controlled manner and, in addition, the possibility of determining the battery current bidirectionally, with which it is possible to realize the monitoring of the charge state of the battery.

Pursuant to the invention, this objective is accomplished by making available a battery monitoring unit with a semiconductor power switch, which is coupled in series with a battery lead. A sense FET circuit arrangement determines the battery current bidirectionally. The power FET part of the arrangement forms the semiconductor power switch.

This battery monitoring unit according to the invention contains a sense FET circuit arrangement, which is designed so that it is capable of determining the battery current, that is, the charging and discharging current of the battery bidirectionally with a sense FET part, so that, by monitoring the battery continuously, a balancing for the charging state of the battery becomes possible. At the same time, the power FET part of the sense FET circuit arrangement functions as a semiconductor power switch, which can be energized and is coupled with the battery lead and over which the battery current can be switched off as required, for example, as short-circuit protection or when the batteries of the vehicle are used as protection against unauthorized use of the vehicle.

In a further development of the invention, the battery monitoring unit is realized as a modular unit, which is positioned close to the battery terminal. Alternatively, it can be integrated with the associated battery terminal into a single component.

In the case of a preferred embodiment of the battery monitoring unit, the sense FET circuit arrangement comprises a suitable evaluation circuit, particularly in the form of a current mirror switching circuit, which transforms the current signal into an asymmetric, ground-related signal In the case of another preferred embodiment of a battery monitoring unit, the sense FET circuit arrangement comprises a single sense FET group with two current decoupling paths as well as a current mirror circuit, connected to one of these paths, so that a bidirectional detection of current is attained by means of the single sense FET group.

In the case of a further developed battery monitoring unit, the sense FET circuit arrangement consists of two parallel, oppositely poled sense FET groups for achieving a bidirectional determination of current.

In the case of a still further developed battery monitoring unit, the possibility of an offset voltage adjustment is created for the sense FET group.

In the case of yet another preferred embodiment of a battery monitoring unit, the power FET part of the sense FET circuit arrangement, which is purposefully appropriately designed, serves additionally as a reverse battery protection circuit for which purpose the power FET part has two oppositely poled power FET groups, which are connected in series.

In the case of a further developed battery monitoring unit, the power FET part is divided into several groups which can be switched off separately. This permits the ratio between the load current and the sense current to be adapted to the magnitude of the load current.

Especially preferred embodiments of the invention as well as a conventional, basic sense FET circuit, which is intended to help in understanding the embodiments, are shown in the drawings and described below.

DETAILED DESCRIPTION OF THE DRAWINGS

Figure 4:
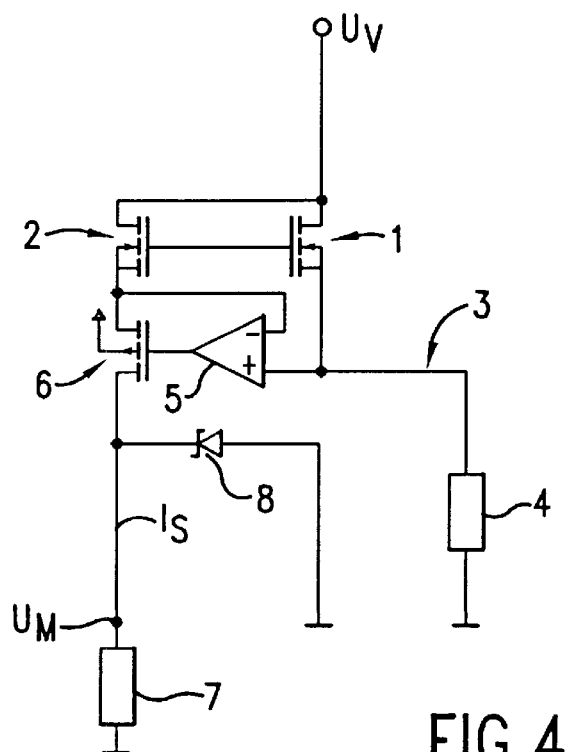
FIG. 4 is a circuit diagram of a conventional, basic sense FET circuit.

For a better understanding of the inventive battery monitoring units, which are described below, the conventional, basic sense FET circuit, which is shown in FIG. 4, is initially described. The basic sense FET circuit serves as a basis for sense FET circuit arrangements, which are provided in the battery monitoring units. The fundamental component of the basic sense FET circuit, as shown in FIG. 4, is a power MOSFET, which is realized as an integrated component and typically consists of several thousand of several tens of thousands individual MOSFET components. The bulk of these, such as fifty thousand, are connected in parallel and thus form a power FET part, which is represented by an n-channel MOSFET 1. A few individual MOSFET components, such as ten, are in turn connected in parallel and form a sense FET part, which is represented by a further n-channel MOSFET 2. The gate connections of the power FET part 1, as well as of the sense FET part 2 are coupled together. Moreover, both MOSFET parts 1, 2 are energized over the same gate voltage, the details of which are not shown, and the drain connection of the two FET parts 1, 2 are connected together.

With its source drain segment, the power FET part 1 lies in the power circuit 3, in which there is, for example, an ohmic load 4. The amperage of the load is to be measured. Together with a p-channel MOSFET 6, the gate electrode of which is controlled by the operational amplifier 5, the operational amplifier 5 forms a current mirror. The sense FET part 2 is adjusted in the current mirror to the same source voltage as the power FET part 1 and a sense current $I_s$ is produced. The sense current $I_s$ is passed through a sense resistance 7. At the same time, the inverting input of the operational amplifier 5 is connected with the source connection of the sense FET part 2, while the non-inverting input of the operational amplifier 5 is connected with the source connection of the power FET part 1. A Zener diode 8 serves as a protective diode.

At the sense resistance 7, a measurement voltage $U_M$ is tapped. The is a proportional measure of the current in the power circuit 3 flowing between ground and the positive supply voltage $U_V$ through the load 4. Assuming that the power amperage is 5 A, a sense current of only about 1 mA results when the ratio of the number of individual transistors in the sense FET part 2 to that in the power FET part 1, given by way of example is 1/5000, so that the ohmic measurement losses at the sense resistance 7 remain correspondingly small.

In the battery monitoring units according to the invention, this sense FET measurement principle is used in various ways. This is done so that a bidirectional detection of battery current with the simultaneous possibility of switching off the battery current and, optionally, an additional reverse battery protection, function are attained. All three battery monitoring units according to the invention, shown in FIGS. 1 to 3, can be realized as modular units arranged close to the battery terminal. Alternatively they can be integrated with an associated battery terminal in a common component, which then can be addressed as an intelligent battery terminal. An important application is the monitoring of motor vehicle batteries; in FIGS. 1 to 3, a section 9 of the battery lead on the battery side and a section 10 of the battery lead of the electrical system of the vehicle are reproduced.

Figure 1:
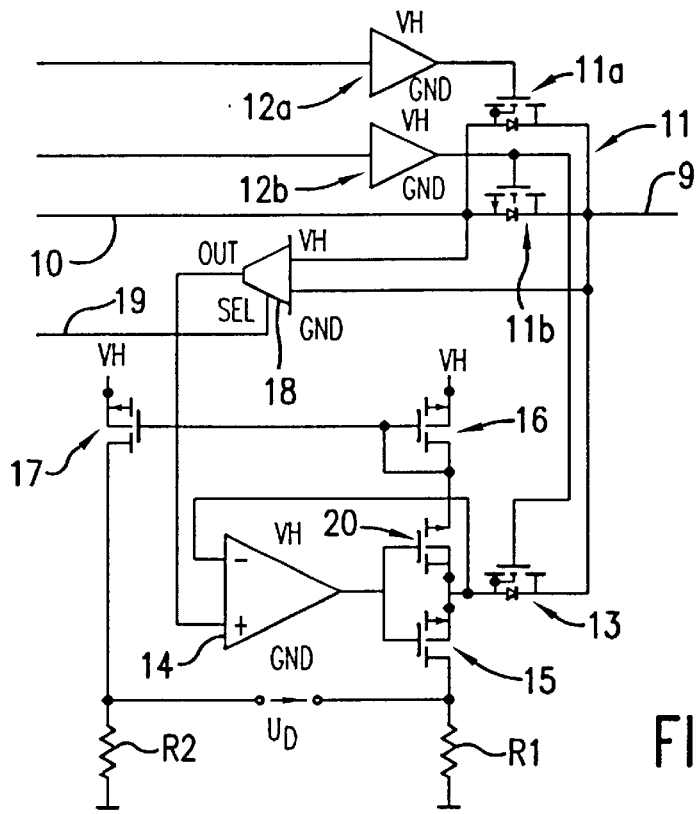
FIG. 1 is a circuit diagram of a battery monitoring unit according to the present invention with a sense FET circuit arrangement for the bidirectional detection of battery current via a single sense FET group.

In the case of the battery monitoring unit of FIG. 1, a sense FET circuit arrangement for the bidirectional determination of battery current is provided. The sense FET circuit arrangement includes a power MOSFET part 11, which is looped into the battery lead 9 and 10 and is represented in FIG. 1 by two power FET groups 11a, 11b. The two power FET groups 11a, 11b are connected in parallel, and each has its own gate control 12a, 12b. Furthermore, the sense FET circuit arrangement comprises a sense FET part in the form of an individual sense MOSFET group 13, the gate connection of which is connected with the gate connection of one of the two power FET groups 11a, 11b, while its drain connection is connected with the drain connections of the two power FET groups 11a, 11b. In general, n-channel MOSFETs are preferred for the power FET part 11 and the sense FET part 13, since they make higher currents possible. The division of the power FET 11 into several subgroups, such as two subgroups 11a and 11b, permits the ratio between the load current and the sense current to be adapted to the level of the load current. Accordingly, at a low load current, a portion of the subgroups can be switched off, as a result of which the measurement wiring is operated in an advantageous working range. As a result, the measuring accuracy of the current can be increased for low load currents.

The sense FET circuit arrangement furthermore comprises an operational amplifier 14 and a p-channel MOSFET 15, through which the sense current of the sense FET part 13 is passed in one direction over a first resistance R1 to ground. In order to also be able to detect a sense current flowing in the other direction and, with that, to make a bidirectional detection of current possible, an n-channel MOSFET 20, the gate connection of which is energized parallel to that of the p-channel MOSFET 15 of the operational amplifier and an adjoining current mirror circuit with two p-channel MOSFETs 16 and 17 and a second resistance R2, which are supplied by an auxiliary voltage VH, are provided, on which the sense current of the sense FET part 13, flowing in this direction, is mirrored. The voltage difference between the potentials at the two sense resistances R1, R2 serves; as the measurement voltage $U_D$.

In accordance with the sense FET principle, the operational amplifier 14 is connected with its inverting input to the source connection of the sense FET part 13, while its non-inverting input is taken to the battery lead 9, 10, the amperage of which is to be measured. The non-inverting operational amplifier input is connected to the battery lead 9, 10 over an analog multiplexer 18, with which an offset adjustment is brought about. For this purpose, the analog multiplexer 18, in response to a control signal 19, applies the potential of the battery terminal side-section 9 of the battery lead 9, 10 to the non-inverting input of the operational amplifier, as a result of which the offset voltage is reproduced precisely over the sense FET part 13. Therefrom, the resulting sense current is measured and stored for correcting a microcontroller (not shown) of the battery monitoring unit. By repeating this adjustment process periodically, any offset drift can be detected and eliminated.

The battery monitoring unit of FIG. 1 in this way performs a very reliable, bidirectional, continuous determination of current with an accuracy in the percent range. This makes battery management by the microcontroller of the battery monitoring unit possible, in that the charging currents and discharging currents of the battery are determined integrally, so that the microcontroller is informed at all times about the charge state of the battery. Moreover, the ability to control the power FET part 11 of the sense FET circuit arrangement, coupled into the battery lead 9, 10, enables the battery circuit to be interrupted in a controlled manner on its high potential side. This can be used, for example, as protection against unauthorized use of the vehicle or as a short circuit protection, for example, as a precautionary measure when an accident danger is recognized. For the battery monitoring unit of FIG. 1, a conventional sense FET part can be used, the measurement cells of which are operated continuously, so that the measurement results are not distorted by switching thresholds or the like, an offset adjustment being realized in a simple manner.

In the case of the circuit construction of FIG. 1, the auxiliary voltage (VH), with which the current mirror is operated, is burdened with the total sense current. At relatively high sense currents of, for example, 10 mA to 50 mA, this cannot be handled readily by a conventional charge pump alone. However, this high sense current occurs only while the battery is being charged and is reduced during the monitoring of the discharging of the battery in the off-load condition to the operating current of the operational amplifier 14. During a sleep function state, controlled by a watchdog element, the inherent current consumption of the circuit can be reduced to a value which is no longer worth mentioning. It is self-evident that, aside from the circuit elements explicitly shown in FIG. 1, further peripheral circuit components are generally present in the battery monitoring unit such as protective wiring and an appropriate no-load current setting of the two MOSFETs 15, 20, which lie in the respective sense FET current decoupling path and are controlled jointly by the operational amplifier 14.

Figure 2:
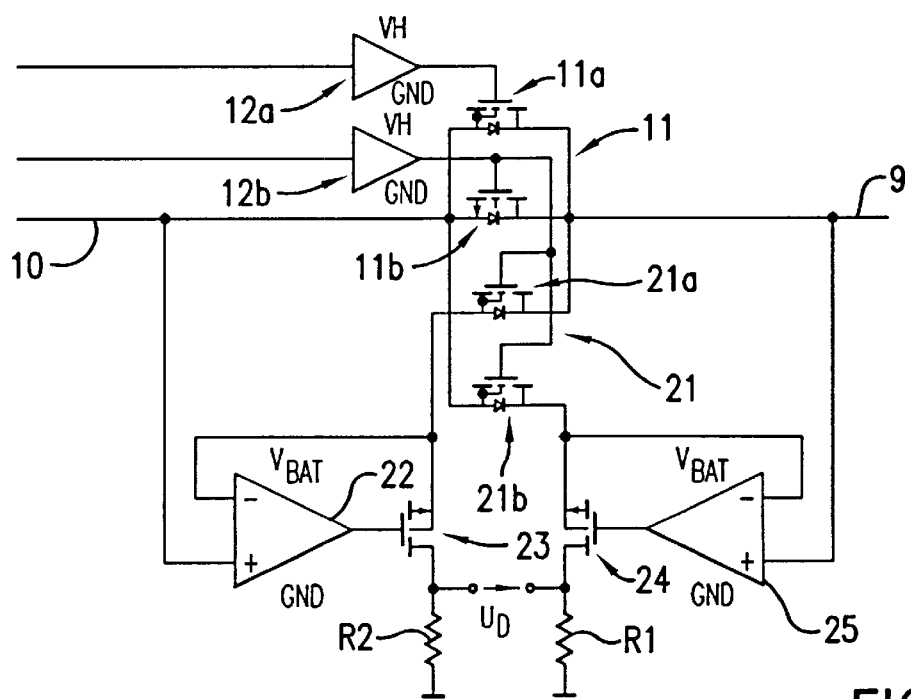
FIG. 2 is a circuit diagram of a battery monitoring unit according to the present invention, similar to that of FIG. 1, however with a sense FET circuit arrangement with two sense FET groups.

A battery monitoring unit, modified from that of FIG. 1, is shown in FIG. 2. Elements having the same function are provided with the same reference numbers and, in this respect, reference is made to the description of FIG. 1. The battery monitoring unit of FIG. 2 comprises a sense FET circuit arrangement with the same power FET part 11 in the battery lead 9, 10 as in FIG. 1, together with the associated gate control 12a, 12b. However, its sense FET part 21 comprises two sense FET groups 21a, 21b, the gate connections of which are connected jointly to the gate connection of one of the two power FET groups 11a, 11b. A first sense FET group 21a is disposed similarly to the sense FET part 13 of FIG. 1, its source connection being taken to ground now over only one current path, which comprises a p-channel MOSFET 23 and the associated sense resistance R2. The p-channel MOSFET 23 is controlled, as in FIG. 1, by an operational amplifier 22, the inverting input of which is connected to the source connection of the associated sense FET group 21a, while its non-inverting input is taken directly to the section 10 of the battery lead 9, 10 of the onboard electrical system of the vehicle.

Mirror symmetrically to this first sense FET group 21a and associated components, the second sense FET group 21b is connected with its source connected directly to the section 10 of the battery lead 9, 10 of the onboard electrical system of the vehicle, while its drain connection is taken to ground over an associated current path which, in mirror image fashion to the current path of the other sense FET group 21a, comprises a p-channel MOSFET 24 and the other sense resistance R1. The p-channel MOSFET 24 is controlled by a second operational amplifier 25, the inverting input of which is connected with the drain connection of the second sense FET group 21b, while its non-inverting input is taken directly to the section 9 of the battery lead 9, 10 on the terminal side of the battery. Once again, the difference $U_D$ between the potentials at the two sense resistances R1, R2 serves as the measurement voltage.

This circuit construction does not require any auxiliary voltage for the measurement circuit part, if so-called rail-to-rail operational amplifiers 22, 25 are used. The gate voltages for the power FET part 11 can be obtained over a conventional charge pump. Compared to the circuit construction of FIG. 1, a simplification is achieved with respect to rectification and polarity indication. In other respects, the advantages and properties, given above in connection with FIG. 1, also apply to the circuit construction of FIG. 2. In particular, appropriate offset adjustment, which is not shown explicitly here, is also possible when required, for which purpose the operational amplifiers 22, 25 are then biased slightly, since the two sense FET measurement branches become currentless at zero voltage, so that a positive offset voltage no longer is detectable.

Figure 3:
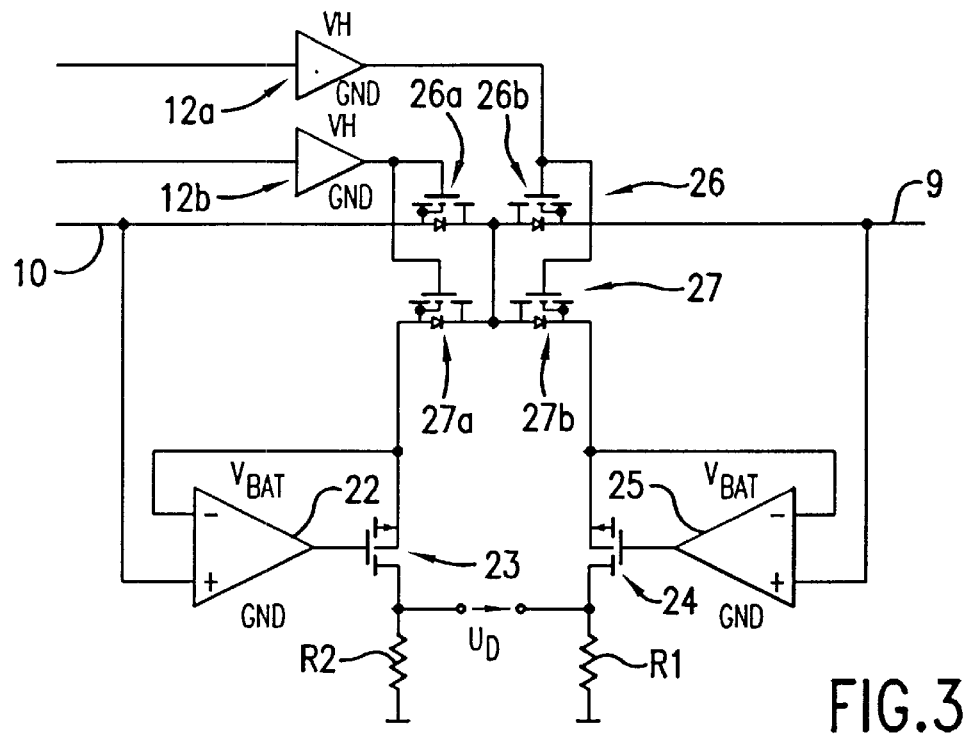
FIG. 3 is a circuit diagram of a battery monitoring unit according to the present invention, similar to that of FIG. 2, however with a power FET part, which fulfills an additional reverse battery protection function.

In FIG. 3, a battery monitoring unit is shown, which corresponds largely, especially with respect to the two mirror image sense FET measurement branches, to that of FIG. 2. Once again, functionally identical components have been provided with the same reference numbers and, for an explanation of these, reference is made to that which is stated in connection with FIG. 2. The sense FET circuit arrangement, used for this battery monitoring unit, comprises a power FET part 26, which consists of two power FET groups 26a, 26b with associated gate controls 12a, 12b, coupled oppositely in series in the battery lead 9, 10. The gate controls 12a, 12b for the two power FET groups 26a, 26b refer, as shown, in each case to their source connection, so as not to generate any undesirably high gate source voltages. Symmetrically to this, the associated sense FET part 27 comprises two sense FET groups 27a, 27b, which are also connected oppositely in series and the drain connections of which are connected with one another as well as with the drain connections of the two power FET groups 26a, 26b, which are also connected with one another. The two symmetrical measuring branches for the sense current of FIG. 2 then adjoin the two source connections of the sense FET groups 27a, 27b. The power and sense FET arrangement is formed by two integrated power DMOSFETs with in each case an associated sense FET group 27a, 27b, which are connected together by their drain connections.

By suitable dimensioning, this arrangement not only offers the possibility of a bidirectional current determination and of a controllable short-circuit protection, but furthermore serves as a reverse battery protection, in that the power FET part 26 conducts with low resistance only when the battery polarity is correct and blocks when the polarity of the two battery leads 9, is reversed. The bidirectional detection of current takes place, as in FIG. 2, by measuring the voltage difference $U_D$ between the two sense resistances R1, R2, a voltage being produced independently of the current direction, once over the one sense resistance R1 and the other time over the other sense resistance R2. In order to bring about a gentle transition between the two current directions and, with that, a gentle passage of the measurement voltage $U_D$ through zero, it is advisable to bias the two current sources of the respective measurement branches, consisting of the respective operational amplifiers 22, 25 with the thereby controlled p-channel MOSFETs 23, 24 in such a manner that there is always a slight no-load current. This avoids a gap during the polarity change, which otherwise could arise due to offset voltages. A polarity indicator is not necessary because of the differential determination of the measurement voltage.

Alternatively to the two power DMOSFETs, named in connection with FIG. 3, the use of a bidirectional power NMOS FET, as described in R. K. Williams et al., The Bidirectional Power NMOS—A New Concept In Battery Disconnect Switching, Proc. of the 1995 Int. Symp. on Power Semicond. Dev. & ICs, Yokahama, page 480, for use as a bidirectional switching element, comes into consideration. Since this requires only a single gate control, one of the two gate controls 12a, 12b of FIG. 3 can be omitted. This bidirectional power NMOS FET is a comb-shaped component, for which the function of the sense FET part in the battery monitoring unit of FIG. 3 can be assumed by short drain source regions instead of by individual transistor cells.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A battery monitoring unit for monitoring a battery current, comprising:
    a sense FET circuit arrangement, the sense FET circuit arrangement comprising:
        a power FET part coupled in series with a battery lead to form a semiconductor power switch for switching-off the battery current; and
        a sense FET part coupled with the power FET part and the battery lead, the sense FET part determining the battery current bidirectionally.

2. The battery monitoring unit according to claim 1, wherein said battery monitoring unit is a modular unit which is capable of being coupled close to a battery terminal.

3. The battery monitoring unit according to claim 1, wherein said battery monitoring unit is a component integrated with a battery terminal of a battery.

4. The battery monitoring unit according to claim 1, wherein said sense FET circuit arrangement further includes an evaluating switching circuit for evaluating a current signal detected with a transformation of the current signal into an asymmetric, ground-related signal.

5. The battery monitoring unit according to claim 4, wherein said evaluating switching circuit is a current mirror switching circuit.

6. The battery monitoring unit according to claim 1, wherein said sense FET circuit arrangement comprises:
    a single sense FET group;
    an operational amplifier for tracking a source potential of said single sense FET group;
    a first sense FET current decoupling path with a first FET component controlled by said operational amplifier, and a first sense resistance connected serially thereto;
    a second sense FET current decoupling path with a second FET component controlled by said operational amplifier; and
    a current mirror circuit with a second sense resistance, a voltage difference between said first and second resistances serving as a measurement voltage.

7. The battery monitoring unit according to claim 4, wherein said sense FET circuit arrangement comprises:
    a single sense FET group;
    an operational amplifier for tracking a source potential of said single sense FET group;
    a first sense FET current decoupling path with a first FET component controlled by said operational amplifier, and a first sense resistance connected serially thereto;
    a second sense FET current decoupling path with a second FET component controlled by said operational amplifier; and
    a current mirror circuit with a second sense resistance, a voltage difference between said first and second resistances serving as a measurement voltage.

8. The battery monitoring unit according to claim 1, wherein said sense FET circuit arrangement comprises in mirror image fashion two sense FET groups having associated sense current measurement branches, each one of which has an operational amplifier for tracking a source or drain potential of the respective sense FET group and an associated current decoupling path having an FET component controlled by said operational amplifier, and a sense resistance connected thereto in series, and
    wherein a voltage difference between the two sense resistances of each sense FET group serves as a measurement voltage.

9. The battery monitoring unit according to claim 4, wherein said sense FET circuit arrangement comprises in mirror image fashion two sense FET groups having associated sense current measurement branches, each one of which has an operational amplifier for tracking a source or drain potential of the respective sense FET group and an associated current decoupling path having an FET component controlled by said operational amplifier, and a sense resistance connected thereto in series, and
    wherein a voltage difference between the two sense resistances of each sense FET group serves as a measurement voltage.

10. The battery monitoring unit according to claim 6, wherein an input of said operational amplifier of the respective sense FET current measurement branch is connected over an offset adjustment step to the battery lead.

11. The battery monitoring unit according to claim 8, wherein an input of said operational amplifier of the respective sense FET current measurement branch is connected over an offset adjustment step to the battery lead.

12. The battery monitoring unit according to claim 1, wherein said power FET part of said sense FET circuit arrangement comprises two power FET groups, looped oppositely in series into the battery lead and to each of which a corresponding sense FET group is assigned and which fulfills a reverse battery protection function for the battery lead.

13. The battery monitoring unit according to claim 4, wherein said power FET part of said sense FET circuit arrangement comprises two power FET groups, looped oppositely in series into the battery lead and to each of which a corresponding sense FET group is assigned and which fulfills a reverse battery protection function for the battery lead.

14. The battery monitoring unit according to claim 6, wherein said power FET part of said sense FET circuit arrangement comprises two power FET groups, looped oppositely in series into the battery lead and to each of which a corresponding sense FET group is assigned and which fulfills a reverse battery protection function for the battery lead.

15. The battery monitoring unit according to claim 8, wherein said power FET part of said sense FET circuit arrangement comprises two power FET groups, looped oppositely in series into the battery lead and to each of which a corresponding sense FET group is assigned and which fulfills a reverse battery protection function for the battery lead.

16. The battery monitoring unit according to claim 1, wherein said power FET part of said sense FET circuit arrangement comprises several parallel power FET groups which can be switched off separately for adapting a ratio of load current to sense current to a load amperage.

17. The battery monitoring unit according to claim 4, wherein said power FET part of said sense FET circuit arrangement comprises several parallel power FET groups which can be switched off separately for adapting a ratio of load current to sense current to a load amperage.

18. The battery monitoring unit according to claim 6 wherein said power FET part of said sense FET circuit arrangement comprises several parallel power FET groups which can be switched off separately for adapting a ratio of load current to sense current to a load amperage.

19. The battery monitoring unit according to claim 8, wherein said power FET part of said sense FET circuit arrangement comprises several parallel power FET groups which can be switched off separately for adapting a ratio of load current to sense current to a load amperage.

* * * * *